(12) United States Patent
Takano et al.

(10) Patent No.: US 6,787,614 B2
(45) Date of Patent: Sep. 7, 2004

(54) THERMOSETTING RESIN COMPOSITION AND PROCESS FOR PRODUCING THE SAME

(75) Inventors: Nozomu Takano, Ibaraki-ken (JP); Kazuhiro Miyauchi, Ibaraki-ken (JP); Hideo Baba, Tochigi-ken (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/127,467

(22) Filed: Apr. 23, 2002

(65) Prior Publication Data

US 2002/0193519 A1 Dec. 19, 2002

(30) Foreign Application Priority Data

Apr. 24, 2001 (JP) ..................................... P2001-125538

(51) Int. Cl.[7] .............................................. C08G 77/38
(52) U.S. Cl. ....................... 525/476; 528/421; 528/418; 528/12; 528/38; 525/523; 549/512; 556/458
(58) Field of Search ................................ 528/421, 418, 528/12, 38; 525/476, 523; 549/512; 556/458

(56) References Cited

U.S. PATENT DOCUMENTS 5,300,594 A * 4/1994 Durvasula et al. .......... 525/502

2002/0018900 A1   2/2002  Kron et al.

FOREIGN PATENT DOCUMENTS

| EP | 0610831 | 8/1994 |
| JP | 7-188609 | 7/1995 |
| JP | 8-100107 | 4/1996 |
| JP | 10-298405 | 11/1998 |
| JP | 11-92623 | 4/1999 |
| JP | 11-240938 | 9/1999 |
| JP | 2000-297263 | 10/2000 |
| WO | 01/05203 | 1/2001 |

OTHER PUBLICATIONS

English Language Abstract of JP 8–100107.
English Language Abstract of JP 10–298405.
English Language Abstract of JP 11–92623.
English Language Abstract of JP 11–240938.
English Language Abstract of JP 2000–297263.
English Language Abstract of JP 7–188609.

* cited by examiner

Primary Examiner—Kuo-Liang Peng
(74) Attorney, Agent, or Firm—Greenblum & Bernstein, P.L.C.

(57) ABSTRACT

There is here disclosed a thermosetting resin composition containing, as essential components, (a) an epoxy resin, (b) a curing agent, and (c) a silicone polymer having a bifunctional siloxane unit represented by the formula $R_2SiO_{2/2}$ (wherein R is the same or a different organic group) in the molecule.

20 Claims, No Drawings

THERMOSETTING RESIN COMPOSITION AND PROCESS FOR PRODUCING THE SAME

BACKGROUND OF THE INVENTION

1. Field of the Invention

The present invention relates to a thermosetting resin composition such as an epoxy resin, and a process for producing the same.

2. Description of the Related Art

Epoxy resins that are one of thermosetting resins are widely employed in uses for electronic materials and coating compositions owing to its excellent moldability, adhesive properties and insulation reliability. Among them, the uses in the electronic materials widely range over laminate sheets and resist inks for printed wiring boards, sealing materials and die bonding materials for semiconductors, and underfiling materials. Recently, as information terminal electronic devices such as personal computers and mobile phones come into wide use, there is remarkable progress in the miniaturization of various electronic parts and the realization of their high performance. For the purpose, mounting parts such as the printed wiring boards and packages mounted thereon need to be thinner and smaller than before and also need to realize high reliability which can endure the high-density mounting.

Under such circumstances, also for the epoxy resins to be used in these electronic parts, enhanced thermal resistance and adhesive properties are required.

Hitherto, the employment of polyfunctional epoxy resins typified by novolak-type and a curing agent is a general method for enhancing the thermal resistance of epoxy resins. However, since their cured products have a high crosslinking density, they inconveniently become hard and brittle. Such hard and brittle resins tend to exhibit the decreased thermal resistance and reduced adhesive properties to a metal after moisture absorption.

On the other hand, as a measure for enhancing the adhesive properties of the epoxy resins, there is a usual way of reducing a crosslinking density of the cured resin products and increasing an elongation of the products. However, when the crosslinking density is reduced, the glass transition temperature (hereinafter, referred to as Tg) also decreases. Therefore, there arises a problem that mechanical properties at a high temperature are deteriorated. Moreover, there is a possibility that the reliability of a wired board is adversely affected. This tendency results in a very serious problem in the current situation that electronic parts become thin and highly dense and the number of reflow times for solder jointing is increasing.

Furthermore, material development or the like based on the consideration of a future global environment, e.g., a solder containing no lead, has been promoted. Thereby, it has been expected that electronic materials be increasingly exposed to a high temperature atmosphere.

Therefore, the epoxy resins are required to possess both of a high thermal resistance and a high toughness. In order to satisfy these requirements, it is important that they have a high Tg and exhibit some degree of low elasticity at a high temperature region.

As a representative method for enhancing the adhesive properties without deteriorating thermal resistance, there is a method of modifying the resins with a thermosetting resin or the like. One example includes a modification by adding a thermally resistant thermoplastic resin having a high toughness to a highly crosslinked thermally resistant hard and brittle epoxy resin. However, as represented by super engineering plastics, a thermoplastic resin excellent in thermal resistance has a high softening point and also has a very high melt viscosity. Therefore, even when an epoxy resin is well modified, the resulting modified epoxy resin has a high melt viscosity. Thus, there arises a problem that moldability is remarkably deteriorated as compared with the conventional epoxy resins generally molded by heating and pressing. Moreover, thermoplastic resins generally have a low polarity and low adhesive properties to a metal and, as a result, the adhesive properties of the modified epoxy resin also decrease in most cases. Additionally, there is a tendency of decrease of elastic modulus at room temperature, so that handleability and rigidity tend to decrease.

In recent years, as one of modification methods for the epoxy resins, blends with an inorganic compound are reported in Japanese Patent Application Laid-Open Nos. 100107/1996, 298405/1998, and 92623/1999. However, all these method comprises adding a hard gelated product having a high elastic modulus into a thermosetting resin by sol-gel method or the like, whereby a high thermal resistance is realized but toughness in a high temperature region decreases.

As mentioned above, an epoxy resin composition with excellent toughness at high temperatures without deterioration in its excellent thermal resistance and moldability has been desired.

SUMMARY OF THE INVENTION

An embodiment of the present invention is a thermosetting resin composition. wherein the storage modulus of a cured product at 25° C. is 1.0 Gpa or more, and the storage modulus thereof at 200° C. is 100 MPa or less.

Furthermore, another embodiment of the invention is a thermosetting resin composition comprising an epoxy resin and a curing agent as essential components, wherein the storage modulus of the cured product at 200° C. is 100 MPa or less.

Moreover, the glass transition temperature of the cured product is preferably 170° C. or higher.

Moreover, the resin composition preferably comprises a silicone polymer containing a bifunctional siloxane unit represented by the formula $R_2SiO_{2/2}$ (wherein R is the same or a different organic group) in the molecule.

Moreover, the resin composition preferably contains 2 parts by weight or more of the silicone polymer with respect to 100 parts by weight of the epoxy resin Furthermore, another embodiment of the present invention is a thermosetting resin composition comprising, as essential components, (a) an epoxy resin, (b) a curing agent, and (c) a silicone polymer containing a bifunctional siloxane unit represented by the formula $R_2SiO_{2/2}$ (wherein R is the same or a different organic group) in the molecule.

Moreover, the curing agent (b) is preferably a phenol resin.

Moreover, the silicone polymer (c) may contain a bifunctional slioxane unit represented by the formula $R_2SiO_{2/2}$ (wherein R is the same or a different organic group) and a trifunctional siloxane unit represented by the formula $RSiO_{3/2}$ (wherein R is the same or a different organic group) in the molecule.

Moreover, the silicone polymer (c) may contain a bifunctional siloxane unit represented by the formula $R_2SiO_{2/2}$ (wherein R is the same or a different organic group) and a tetrafunctional siloxane unit represented by the formula $SiO_{4/2}$ in the molecule.

Moreover, the silicone polymer (c) may contain a bifunctional siloxane unit represented by the formula $R_2SiO_{2/2}$ (wherein R is the same or a different organic group), a trifunctional siloxane unit represented by the formula $RsiO_{3/2}$ (wherein R is the same or a different organic group), and a tetrafunctional siloxane unit represented by the formula $SiO_{4/2}$ in the molecule.

Moreover, the silicone polymer (c) preferably contains the above bifunctional siloxane unit in the molecule in an amount of 10 mol % or more of the total silicone polymer.

Moreover, an average polymerization degree of the silicone polymer (c) is preferably from 2 to 2000.

Moreover, a blend amount of the silicone polymer (c) is preferably 2% by weight or more with respect to the epoxy resin.

Moreover, at least one end of the silicone polymer (c) is preferably a silanol group or an alkoxy group.

Moreover, the resin composition further preferably comprises a coupling agent.

Moreover, the silicone polymer (c) may contain a monomer of a bifunctional silane compound, a trifunctional silane compound, or a tetrafunctional silane compound.

Moreover, the silicone polymer (c) may contain a homo-type oligomer of one compound selected from a bifunctional silane compound, a trifunctional silane compound and a tetrafunctional silane compound, or a composite-type oligomer of two or more compounds thereof.

Furthermore, another embodiment of the present invention is a process for producing the above thermosetting resin composition, which comprises a step of mixing the above components (a), (b), and (c) at the same time.

Furthermore, another embodiment of the present invention is a process for producing the above thermosetting resin composition, which comprises a step of mixing/stirring the above components (a), (b), and (c) at the same time in the presence of a solvent.

Furthermore, another embodiment of the present invention is a process for producing the above thermosetting resin composition, which comprises a step of directly using, as the silicone polymer (c), a solution obtainable by oligomerizing a mixture of a bifunctional silane compound and a trifunctional silane compound and/or a tetrafunctional silane compound in the presence of a catalyst.

The present disclosure relates to subject matter contained in Japanese Patent Application No. 2001-125538, filed on Apr. 24, 2001, the disclosure of which is expressly incorporated herein by reference in its entirety.

DETAILED DESCRIPTION OF THE INVENTION

An epoxy resin (a) to be used in the present invention is not particularly limited as far as it is polyfunctional. The epoxy resin, though it is not limited, but includes, for example, bisphenol-type epoxy resins such as bisphenol A-type epoxy resins, bisphenol F-type epoxy resins, and bisphenol S-type epoxy resin, novolak-type epoxy resins such as phenol novolak-type epoxy resins, cresol novolak-type epoxy resins, bisphenol A novolak-type epoxy resins, and bisphenol F novolak-type epoxy resins, alicyclic epoxy resins, glycidyl ester-type epoxy resins, glycidylamine-type epoxy resins, hydantoin-type epoxy resins, isocyanurate-type epoxy resins, aliphatic linear epoxy resins, and halides and hydrogenated products thereof. Such epoxy resins may have any molecular weight. Several kinds of epoxy resins may be used in combination. Bisphenol-type epoxy resins and novolak-type epoxy resins are preferably used, and from the viewpoint of thermal resistance, novolak-type epoxy resins are particularly preferred.

A curing agent (b) to be used in the present invention, various agents hitherto known as curing agents for epoxy resins can be used and are not particularly limited. The curing agent, though it is not limited, includes, for example, dicyandiamide, diaminodiphenylmethane, diaminodiphenyl sulfone, phthalic anhydride, pyromellitic anhydride, polyfunctional phenol resins such as phenol novolak and cresol novolak, and the like. Several kinds of these curing agents may be used in combination. From the view point of low moisture absorption, a phenol resin is preferable. Specifically, in order to enhance thermal resistance by enhancing Tg or the like, novolak-type phenol resins are more preferable. The blend amount of the curing agent is not particularly limited but is preferably from about 0.5 to 1.5 equivalents to the functional group of the epoxy resin.

A silicone polymer (c) to be used in the present invention, which is used for the purpose of enhancing toughness at a high temperature region, is not particularly limited as far as it includes at least bifunctional siloxane unit ($R_2SiO_{2/2}$) in the siloxane units. As the silicone polymer, at least one siloxane unit selected from a trifunctional siloxane unit ($RSiO_{3/2}$) and a tetrafunctional siloxane unit ($SiO_{4/2}$) (wherein R has the same meaning as described above) may be used in combination with a bifunctional siloxane unit. The average polymerization degree is preferably from 2 to 2000, more preferably from 5 to 1000, and particulary preferably is from 10 to 100. The average polymerization degree is calculated from the molecular weight of the polymer (in the case of low polymerization degree) or the number-average molecular weight measured by gel permeation chromatography using a calibration curve of standard polystyrene or polyethylene glycol. The silicone polymer may also contain monomers of various siloxane units and composite oligomers thereof. However, when the average polymerization degree exceeds 2000, the viscosity becomes too high and thus homogeneous dispersion tends to be difficult.

The above organic group of R, though it is not limited, includes, for example, alkyl groups having 1 to 4 carbon atoms, phenyl group, and the like. Moreover, the functional group of the oligomer end, though it is not limited, includes, for example, silanol groups, alkoxy groups having 1 to 4 carbon atoms, acyloxy groups having 1 to 4 carbon atoms, and the like.

The silicone polymer in the present invention aims for the enhancement of toughness in high temperature regions. The polymer obtained by polymerizing only a trifunctional siloxane unit and a tetrafunctional siloxane unit is too hard, hence it tends to be difficult to obtain high toughness.

The polymers may comprise: only a bifunctional siloxane unit; a bifunctional siloxane unit and a tetrafunctional siloxane unit; a bifunctional siloxane unit and a trifunctional siloxane unit; and a bifunctional siloxane unit, a trifunctional siloxane unit, and a tetrafunctional siloxane unit. Moreover, in order to homogeneously disperse the silicone polymer in a cured resin product, it is preferable that at least one end of the silicone polymer has a functional group. A silicone polymer without functional group is difficult to enter into an epoxy resin and hence, it tends to ooze out onto the surface of the cured resin product and be difficult to disperse homogeneously.

The blend amount of the monomer forming a siloxane unit is adjusted so that a bifunctional siloxane unit is from 10 to 100 mol %, preferably 25 to 90 mol %, and the total of a trifunctional siloxane unit and a tetrafunctional siloxane unit is from 0 to 90 mol %, preferably from 10 to 75 mol % with respect to the total siloxane units.

The siloxane polymer in the present invention can be obtained by hydrolysis and polycondensation of a silane compound represented by the following general formula (I).

$$R'_n SiX_{4-n} \qquad (I)$$

In the above formula, X represents —OR, and R represents an alkyl group having 1 to 4 carbon atoms or an alkylcarbonyl group having 1 to 4 carbon atoms. Moreover, R' represents an alkyl group having 1 to 4 carbon atoms or an aryl group such as phenyl group, and n means an integer of 0 to 2.

The silane compound represented by the above general formula (I) is not limited, but includes, for example: tetrafunctional silane compounds (hereinafter, "functional" in the silane compounds means possessing a condensation-reactive functional group) such as tetraalkoxysilanes, e.g., $Si(OCH_3)_4$, $Si(OC_2H_5)_4$,
$Si(OC_3H_7)_4$, $Si(OC_4H_9)_4$;

trifunctional silane compounds such as monoalkyltrialkoxysilanes, e.g., $H_3CSi(OCH_3)_3$, $H_5C_2Si(OCH_3)_3$,
$H_7C_3Si(OCH_3)_3$, $H_9C_4Si(OCH_3)_3$,
$H_3CSi(OC_2H_5)_3$, $H_5C_2Si(OC_2H_5)_3$,
$H_7C_3Si(OC_2H_5)_3$, $H_9C_4Si(OC_2H_5)_3$,
$H_3CSi(OC_3H_7)_3$, $H_5C_2Si(OC_3H_7)_3$,
$H_7C_3Si(OC_3H_7)_3$, $H_9C_4Si(OC_3H_7)_3$,
$H_3CSi(OC_4H_9)_3$, $H_5C_2Si(OC_4H_9)_3$,
$H_7C_3Si(OC_4H_9)_3$, $H_9C_4Si(OC_4H_9)_3$, phenyltrialkoxysilanes, e.g., $PhSi(OCH_3)_3$, $PhSi(OC_2H_5)_3$,
$PhSi(OC_3H_7)_3$, $PhSi(OC_4H_9)_3$, (wherein Ph represents phenyl group. The same shall apply to the following);

monoalkyltriacyloxysilanes, e.g., $(H_3CCOO)_3SiCH_3$, $(H_3CCOO)_3SiC_2H_5$,
$(H_3CCOO)_3SiC_3H_7$, $(H_3CCOO)_3SiC_4H_9$;

bifunctional silane compounds such as dialkyldialkoxysilanes, e.g., $(H_3C)_2Si(OCH_3)_2$, $(H_5C_2)_2Si(OCH_3)_2$,
$(H_7C_3)_2Si(OCH_3)_2$, $(H_9C_4)_2Si(OCH_3)_2$,
$(H_3C)_2Si(OC_2H_5)_2$, $(H_5C_2)_2Si(OC_2H_5)_2$,
$(H_7C_3)_2Si(OC_2H_5)_2$, $(H_9C_4)_2Si(OC_2H_5)_2$,
$(H_3C)_2Si(OC_3H_7)_2$, $(H_5C_2)_2Si(OC_3H_7)_2$,
$(H_7C_3)_2Si(OC_3H_7)_2$, $(H_9C_4)_2Si(OC_3H_7)_2$,
$(H_3C)_2Si(OC_4H_9)_2$, $(H_5C_2)_2Si(OC_4H_9)_2$,
$(H_7C_3)_2Si(OC_4H_9)_2$, $(H_9C_4)_2Si(OC_4H_9)_2$, diphenyldialkoxysilanes, e.g., $Ph_2Si(OCH_3)_2$, $Ph_2Si(OC_2H_5)_2$, dialkyldiacyloxysilanes, e.g., $(H_3CCOO)_2Si(CH_3)_2$, $(H_3CCOO)_2Si(C_2H_5)_2$,
$(H_3CCOO)_2Si(C_3H_7)_2$, $(H_3CCOO)_3Si(C_4H_9)_2$, and the like.

Among the silane compounds represented by the above general formula (I), the bifunctional silane compound is used as an essential component, and the trifunctional silane compound and tetrafunctional silane compound are optionally used, if necessary. In particular, from the viewpoint of hydrolysis speed, dialkyldialkoxysilane as the bifunctional silane compound, monoalkyltrialkoxysilane as the trifunctional silane compound and tetraalkoxysilane as the tetrafunctional silane compound are preferred.

The silicone polymer is produced by hydrolysis and polycondensation of a silane compound represented by the general formula (I). In this process, a catalyst is preferably used to prevent from the composition gelled. A catalyst, though it is not limited, includes, for example, an inorganic acid such as hydrochloric acid, sulfuric acid, phosphoric acid, nitric acid, or hydrofluoric acid or an organic acid such as oxalic acid, maleic acid, a sulfonic acid, or formic acid, and a basic catalyst such as ammonia or trimethylammonium. The catalyst is used in an appropriate amount depending on the amount of the silane compound represented by the general formula (I), but it is preferably used in the range of 0.001 to 0.5 mol per mol of the silane compound represented by the general formula (I).

Moreover, it is important to conduct the above hydrolysis and polycondensation before mixing with an epoxy resin composition. In the reaction, in order to obtain a uniform polymer, any solvent may be employed. The solvent to be used is not particularly limited, but includes, for example, various alcohols, ketones, cellosolves, amides, and the like. Furthermore, the reaction is accelerated by water. The amount of water is optionally determined. However, the amount is usually employed in an amount of 5 mol or less, preferably the range of 0.1 to 2 mol per mol of the alkoxy group. In a case of excess water, there possibly occurs a problem that the storage stability of the silicone polymer decreases or the toughness of the cured resin product decreases.

In order to strengthen the interaction between a silicone polymer and a resin, the resin composition may contain various coupling agents. The coupling agents include silane coupling agents, titanate coupling agents, and the like. The silane coupling agents generally include epoxysilanes, aminosilanes, cationic silanes, vinylsilanes, acrylic silanes, mercaptosilanes, and a composite thereof.

The blend amount of the silicone polymer depends on the resin composition to be used, the level of toughness to be obtained, the composition of the silicone polymers and the like. The amount is not particularly limited, but it is preferably from 2 to 50% by weight with respect to the epoxy resin. When it is less than 2% by weight, the effect of enhancing toughness is small, and when it is more than 50% by weight, thermal resistance tends to decrease.

In the epoxy resin composition of the present invention, a curing accelerator may be employed for the purpose of the acceleration of curing. The curing accelerator is not particularly limited as far as it accelerates the reaction of the epoxy resin with the curing agent. The curing accelerator, though not limited, includes, for example, an imidazole compound, an organic phosphorus compound, a tertiary amine, a quaternary ammonium salt, and the like may be employed. The imidazole compound, though it is not limited, includes for example, imidazole, 2-ethylimidazole, 2-ethyl-4-methylimidazole, 2-phenylimidazole, 2-undecylimidazole, 1-benzyl-2-methylimidazole, 2-heptadecylimidazole, 4,5-diphenylimidazole, 2-methylimidazoline, 2-phenylimidazoline, 2-undecylimidazoline, 2-heptadecylimidazoline, 2-isopropylimidazole, 2,4-dimethylimidazole, 2-phenyl-4-methylimidazole, 2-ethylimidazoline, 2-isopropylimidazoline, 2,4-dimethylimidazoline, 2-phenyl-4-methylimidazollne, and the like, and the compounds of which the imino group is masked are also mentioned.

The masking agent includes acrylonitrile, phenylene diisocyanate, toluene diisocyanate, naphthalene diisocyanate, hexamethylene diisocyanate, methylene bisphenylisocyanate, melamine acrylate, and the like.

Several kinds of curing accelerators may be used in combination. The blend amount is preferably from 0.01 to 5 parts by weight with respect to 100 parts by weight of the epoxy resin. When the amount is less than 0.01 parts by weight, the accelerating effect tends to be small, and when it is more than 5 parts by weight, storage stability tends to be deteriorated.

The epoxy resin composition of the present invention may be mixed with an inorganic filler, if necessary. The inorganic filler, though not limited, includes for example, silica, clay, talc, mica, aluminum hydroxide, calcium carbonate, alumina, glass fiber, glass powder, and the like.

In the case of using inorganic filler, a solvent is used to dilute the composition, and a varnish is obtained. The solvent is not particularly limited, but includes, for example, acetone, methyl ethyl ketone, toluene, xylene, methyl isobutyl ketone, ethyl acetate, ethylene glycol monomethyl ether, N,N-dimethylformamide, methanol, ethanol, and the like. These may be used solely or as a mixture of two or more kinds of them. Moreover, the solid mass concentration of the varnish is not particularly limited, and may be optionally changed depending on the resin composition, presence or absence of the inorganic filler, the blend amount thereof and the like.

In the varnish obtained by mixing the above, each component is dried for the purpose of evaporating the solvent and curing the resin to some extent, and then cured with heating to obtain a cured product. The heating temperature and time widely vary depending on the resin composition, the composition of the silicone polymer, and the like, but the curing is generally conducted at a temperature of 20 to 230° C. for a period of 15 minutes to 24 hours. If necessary, molding under pressure may be conducted. The cured product exhibits the desired toughness by dispersing a silicone gelated product of several $\mu$m or less into the epoxy resin cured product.

In general, in view of the handleability and rigidity of the printed wiring board, the resin composition for use in the printed wiring board requires that the storage modulus of the cured product at room temperature should be 1.0 GPa or more. There is no particular upper limit of storage modulus of the cured product at room temperature, but the limit is usually about 10.0 GPa in view of the balance with other properties. Furthermore, in view of the thermal resistance at solder reflow and the adhesive properties to a metal, the storage modulus of the cured resin product is necessarily 100 MPa or less. preferably, 80 MPa or less at high temperatures of 200° C. or higher. There is no particular lower limit of the storage modulus of the cured product under a high temperature, but usually about 1 MPa. Low Tg of the cured resin product may results in deterioration of the mechanical properties at a high temperature and adverse effects on reliability of the wiring board such as reliability of connection of throughhole, so that Tg is preferably 170° C. or higher. A higher Tg is more preferable and thus there is no particular upper limitation, but in the case of using an epoxy resin as a thermosetting resin, the upper limit is generally abort 200° C.

As described above, the use of the resin composition wherein the storage modulus of the cured product is 1.0 GPa or more at room temperature and 100 MPa or less under a high temperature of 200° C. or higher enables the production of an printed wiring board excellent in handleability, rigidity of molded product, thermal resistance, adhesiveness, reliability, and the like. As such a resin composition. an epoxy resin composition wherein the storage modulus of the cured resin product is 100 MPa or less under a high temperature of 200° C. or higher can be employed, and specitic examples include epoxy resin compositions containing the above silicone polymer.

The following will specifically explain the present invention with reference to Examples, but the invention is not limited thereto. By the way, "part(s)" in Examples and Comparative Examples means "part(s) by weight".

EXAMPLE 1

Into a solution of 40 g of dimethoxydimethylsilane and 10 g of methanol in a glass flask equipped with a stirring apparatus, a condenser, and a thermometer were added 0.33 g of acetic acid and 12 g of distilled water, and then the whole was stirred at 50° C. for 8 hours to obtain a silicone polymer solution. An average polymerization degree of the siloxane repeating unit in the silicone polymer thus obtained was 10.

Then, 100 parts of a cresol novolak-type epoxy resin (manufactured by Sumitomo Chemical Co., Ltd., trade name: ESCN-195, epoxy equivalent: 195), 55 parts of a phenol novolak resin (manufactured by Hitachi Chemical Co., Ltd., trade name: HP-850N, hydroxyl equivalent: 106), 0.5 part of 2-ethyl-4-methylimidazole, and 35 parts of methyl ethyl ketone were mixed to obtain an epoxy resin composition.

Thereafter, with the epoxy resin composition were mixed 25 parts, in terms of solid mass, of the silicone polymer solution obtained in the above, whereby a varnish was prepared.

EXAMPLE 2

Under the same conditions as in Example 1, into a solution of 30 g of dimethoxydimethylsilane, 10 g of tetramethoxysilane, and 10 g of methanol were added 0.31 g of acetic acid and 13.7 g of distilled water, and then the whole was stirred to obtain a silicone polymer solution. An average polymerization degree of the siloxane repeating unit in the silicone polymer thus obtained was 18.

With the epoxy resin composition obtained in Example 1 were mixed 25 parts, in terms of solid mass, of the silicone polymer solution, whereby a varnish was prepared.

EXAMPLE 3

Under the same conditions as in Example 1, into a solution of 20 g of dimethoxydimethylsilane, 20 g of tetramethoxysilane, and 10 g of methanol were added 0.29 g of acetic acid and 15.5 g of distilled water, and then the whole was stirred to obtain a silicone polymer solution. An average polymerization degree of the siloxane repeating unit in the silicone polymer thus obtained was 24.

With the epoxy resin composition obtained in Example 1 were mixed 25 parts, in terms of solid mass, of the silicone polymer solution, whereby a varnish was prepared.

EXAMPLE 4

Under the same conditions as in Example 1, into a solution of 20 g of dimethoxydimethylsilane, 20 g of trimethoxymethylsilane, and 10 g of methanol were added 0.31 g of acetic acid and 14 g of distilled water, and then the whole was stirred to obtain a silicone polymer solution. An average polymerization degree of the siloxane repeating unit in the silicone polymer thus obtained was 20.

With the epoxy resin composition obtained in Example 1 were mixed 25 parts, in terms of solid mass, of the silicone polymer solution, whereby a varnish was prepared.

EXAMPLE 5

Under the same conditions as in Example 1, into a solution of 30 g of dimethoxydimethylsilane, 10 g of trimethoxymethylsilane, and 10 g of methanol were added 0.32 g of acetic acid and 13 g of distilled water, and then the whole was stirred to obtain a silicone polymer solution. An average polymerization degree of the siloxane repeating unit in the silicone polymer thus obtained was 11.

With the epoxy resin composition obtained in Example 1 were mixed 25 parts, in terms of solid mass, of the silicone polymer solution, whereby a varnish was prepared.

EXAMPLE 6

Under the same conditions as in Example 1, into a solution of 20 g of dimethoxydimethylsilane, 10 g of trimethoxymethylsilane, 10 g of tetramethoxysilane, and 10 g of methanol were added 0.15 g of acetic acid and 14.8 g of distilled water, and then the whole was stirred to obtain a silicone polymer solution. An average polymerization degree of the siloxane repeating unit in the silicone polymer thus obtained was 25.

With the epoxy resin composition obtained in Example 1 were mixed 25 parts, in terms of solid mass, of the silicone polymer solution, whereby a varnish was prepared.

EXAMPLE 7

With the silicone polymer solution obtained in Example 2 was mixed γ-glycidoxypropyltrimethoxysilane (manufactured by Nippon Unicar Co., Ltd., trade name: A-187) as a silane coupling agent (CP) so as to be the silicone polymer: A-187=50:50.

With the epoxy resin composition obtained in Example 1 was mixed 25 parts, in terms of solid mass, of the solution, whereby a varnish was prepared.

EXAMPLE 8

With the epoxy resin composition used in Example 1 were mixed 12 parts, in terms of solid mass, of the silicone polymer solution obtained in Example 2, whereby a varnish was prepared.

EXAMPLE 9

With the epoxy resin composition obtained in Example 1 were mixed 150 parts, in terms of solid mass, of the silicone polymer solution obtained in Example 2 and further 5 parts of methyl ethyl ketone, whereby a varnish was prepared.

EXAMPLE 10

A silicone polymer solution was obtained in the same manner as in Example 3 with the exception that the stirring time was changed from 8 hours to 24 hours. An average polymerization degree of the siloxane repeating unit in the silicone polymer thus obtained was 98.

With the epoxy resin composition obtained in Example 1 were mixed 25 parts, in terms of solid mass, of the polymer solution, whereby a varnish was prepared.

EXAMPLE 11

One hundred parts of a cresol novolak-type epoxy resin (manufactured by Sumitomo Chemical Co., Ltd., trade name: ESCN-195, epoxy equivalent: 195), 6 parts of dicyandiamide (manufactured by Nippon Carbide Industries Co., Inc., active hydrogen equivalent: 21), 0.5 part of 2-ethyl-4-methylimidazole, and 35 parts of methyl ethyl ketone were mixed to obtain an epoxy resin composition.

Then, with the above epoxy resin composition were mixed 25 parts, in terms of solid mass, of the silicone polymer solution obtained in example 2, whereby a varnish was prepared.

COMPARATIVE EXAMPLE 1

The epoxy resin composition obtained in Example 1 was used as it is.

COMPARATIVE EXAMPLE 2

The epoxy resin composition obtained in Example 11 was used as it is.

COMPARATIVE EXAMPLE 3

Into a solution of 40 g of tetramethoxysilane and 93 g of methanol in a glass flask equipped with a stirring apparatus, a condenser, and a thermometer were added 0.47 g of acetic acid and 18.9 g of distilled water, and then the whole was stirred at 50° C. for 8 hours to obtain a polymer solution comprising a silicone oligomer. An average polymerization degree of the siloxane repeating unit in the silicone oligomer thus obtained was 20.

With the epoxy resin composition obtained in Example 1 were mixed 25 parts, in terms of solid mass, of the polymer solution, whereby a varnish was prepared.

COMPARATIVE EXAMPLE 4

In the same manner as in Example 1, into a solution of 40 g of trimethoxymethylsilane and 93 g of methanol were added 0.53 g of acetic acid and 15.8 g of distilled water, and then the whole was stirred at 50° C. for 8 hours to obtain a polymer solution comprising a silicone oligomer. An average polymerization degree of the siloxane repeating unit in the silicone oligomer thus obtained was 15.

With the epoxy resin composition obtained in Example 1 were mixed 25 parts, in terms of solid mass, of the polymer solution, whereby a varnish was prepared.

COMPARATIVE EXAMPLE 5

In the same manner as in Example 1, into a solution of 20 g of trimethoxymethylsilane, 22 g of tetramethoxysilane, and 98 g of methanol were added 0.52 g of acetic acid and 18.3 g of distilled water, and then the whole was stirred at 50° C. for 8 hours to obtain a polymer solution comprising a silicone oligomer. An average polymerization degree of the siloxane repeating unit in the silicone oligomer thus obtained was 25.

With the epoxy resin composition used in Example 1 were mixed 25 parts, in terms of solid mass, of the polymer solution, whereby a varnish was prepared.

COMPARATIVE EXAMPLE 6

With the epoxy resin composition obtained in Example 1 was mixed 25 parts, in terms of solid mass, of γ-glycidoxypropyltrimethoxysilane (manufactured by Nippon Unicar Co., Ltd., trade name: A-187) as a silane coupling agent (CP) instead of the silicone polymer solution, whereby a varnish was prepared.

COMPARATIVE EXAMPLE 7

With the epoxy resin composition used in Example 1 was mixed 25 parts, in terms of solid mass, of a silicone rubber powder (SRP) (manufactured by Toray Dow Corning Silicone Co., Ltd., trade name: Torayfil E601) instead of the silicone polymer solution, whereby a varnish was prepared.

Each of the varnishes prepared in Examples 1 to 11 and Comparative Examples 1 to 7 were applied to a polyethylene terephthalate (PET) film having a thickness of about 0.1 mm, which was dried under heating at 150° C. for 5 minutes. The resulting resin was crumbed from the PET film to obtain a resin powder of B stage. A resin plate was prepared by placing a necessary amount of resin powder into a spacer having a thickness of 1.6 mm, laying a copper foil having a thickness of 18 μm onto both aides of the spacer so that the glossy surface of the copper foil faces inside, pressing it at 170° C. for 90 minutes at 4.0 MPa, and detaching the copper foils.

Upon the resin plates thus obtained, dynamic viscoelasticity was measured in accordance with the following method, and the results are shown in Table 1.

(Measurement of Dynamic Viscoelasticity)

Using an apparatus named RSA-11 manufactured by Rheometric Co., Ltd. as a viscoelasticity measuring apparatus, dynamic viscoelasticity was measured under elevating a temperature from 25 to 250° C. (elevating rate: 10° C./minute) at a distance between span and span of 6 mm at tensile mode. The test piece size was 5 mm×20 mm. Storage modulus was determined from the viscoelasticity curve obtained, and Tg from the maximum value of tan δ.

TABLE 1

| Items | Example 1 | Example 2 | Example 3 |
|---|---|---|---|
| Silicone Polymer | Bifunctional — — — | Bifunctional Tetra-functional — — | Bifunctional Tetra-functional — — |
| Siloxane Repeating Unit | 10 | 18 | 24 |
| Blend amount | 25 | 25 | 25 |
| Storage Modulus | | | |
| 25° C. (GPa) | 1.1 | 1.2 | 1.3 |
| 200° C. (MPa) | 50 | 65 | 85 |
| Tg (° C.) | 170 | 180 | 190 |

| Items | Example 4 | Example 5 | Example 6 | Example 7 |
|---|---|---|---|---|
| Silicone Polymer | Bifunctional Trifunctional — | Bifunctional Trifunctional — | Bifunctional Trifunctional Tetra-functional | Bifunctional Tetra-functional CP |
| Siloxane Repeating Unit | 20 | 11 | 25 | — |
| Blend Amount (pts. Wt.) | 25 | 25 | 25 | 25 |
| Storage Modulus | | | | |
| 25° C. (GPa) | 1.2 | 1.2 | 1.2 | 1.2 |
| 200° C. (MPa) | 80 | 60 | 75 | 70 |
| Tg (° C.) | 185 | 182 | 184 | 185 |

TABLE 1-continued

| Items | Example 8 | Example 9 | Example 10 | Example 11 |
|---|---|---|---|---|
| Silicone Polymer | Bifunctional Tetra-functional | Bifunctional Tetra-functional | Bifunctional Tetra-functional | Bifunctional Tetra-functional |
| Siloxane Repeating Unit | 18 | 18 | 98 | 18 |
| Blend Amount (pts. Wt.) | 12 | 150 | 25 | 25 |
| Storage Modulus | | | | |
| 25° C. (GPa) | 1.2 | 1.1 | 1.3 | 1.1 |
| 200° C. (MPa) | 86 | 51 | 63 | 58 |
| Tg (° C.) | 180 | 178 | 190 | 191 |

| Items | Comp. Example 1 | Comp. Example 2 | Comp. Example 3 |
|---|---|---|---|
| Silicone Polymer | — — — | — — — | Tetrafunctional — — |
| Siloxane Repeating Unit | — | — | 20 |
| Blend Amount (pts. wt.) | — | — | 25 |
| Storage Modulus | | | |
| 25° C. (GPa) | 1.2 | 1.1 | 1.4 |
| 200° C. (MPa) | 115 | 105 | 145 |
| Tg (° C.) | 175 | 185 | 188 |

| Items | Comp. Example 4 | Comp. Example 5 | Comp. Example 6 | Comp. Example 7 |
|---|---|---|---|---|
| Silicone Polymer | Trifunctional — — | Trifunctional Tetrafunctional — | CP — — | SRP — — |
| Siloxane Repeating Unit | 15 | 25 | — | — |
| Blend Amount (pts. wt.) | 25 | 25 | 25 | 25 |
| Storage Modulus | | | | |
| 25° C. (GPa) | 1.3 | 1.4 | 1.2 | 0.5 |
| 200° C. (MPa) | 140 | 142 | 125 | 55 |
| Tg (° C.) | 183 | 185 | 180 | 190 |

From table 1, the following are apparent.

The compositions of Examples 1 to 11 exhibit almost no decrease in Tg and storage modulus at 25° C.

However, in comparison to the Examples 1 to 11, the compositions of Comparative Examples 1 and wherein no silicon polymer is mixed, decrease in storage modulus at 200° C.

The compositions of Comparative Examples 3 to 6 exhibit higher Tg, but higher storage modulus at 200° C. as compared with the composition of Comparative Example 1.

The composition of Comparative Example 7 exhibits also higher Tg but marked decrease in storage modulus over all the temperature regions.

As shown in the above, the elastic modulus of the compositions of Examples is 100 MPa or less, and thus it is understood that they exhibit an excellent toughness at a high temperature.

According to the Examples, the composition exhibits an excellent toughness at a high temperature after curing, and hence it is excellent in moldability and adhesiveness. Additionally, it exhibits no decrease in elastic modulus at ambient temperature, and hence is excellent in rigidity and handleability. Furthermore, it is possible to form a highly reliable substrate board by selecting a thermosetting resin in which a high Tg is maintained.

It should be understood that the foregoing relates to only a preferred embodiment of the invention, and it is intended to cover all changes and modifications of the examples of the invention herein chosen for the purposes of the disclosure, which do not constitute departures from the sprit and scope of the invention.

What is claimed is:

1. A thermosetting resin composition, wherein a storage modulus of a cured product at 25° C. is 1.0 GPa or more, and a storage modulus thereof at 200° C. is 100 MPa or less, and a glass transition temperature of the cured product is 170° C. or higher.

2. A thermosetting resin composition, wherein a storage modulus of a cured product at 25° C. is 1.0 GPa or more, and a storage modulus thereof at 200° C. is 100 MPa or less, and which contains a silicone polymer having a bifunctional siloxane unit represented by the formula $R_2SiO_{2/2}$ (wherein R is the same or a different organic group) in the molecule.

3. The thermosetting resin composition according to claim 2, which contains 2 parts by weight or more of the silicone polymer with respect to 100 parts by weight of resin.

4. A thermosetting resin composition comprising, as essential components, (a) an epoxy resin, (b) a curing agent, and (c) a silicone polymer containing a bifunctional siloxane unit represented by the formula $R_2SiO_{2/2}$ (wherein R is the same or a different organic group) in the molecule, and the curing agent (b) includes a phenol resin.

5. The thermosetting resin composition according to claim 4, wherein the silicone polymer (c) contains a bifunctional siloxane unit represented by the formula $R_2SiO_{2/2}$ (wherein R is the same or a different organic group) and a trifunctional siloxane unit represented by the formula $RSiO_{3/2}$ (wherein R is the same or a different organic group) in the molecule.

6. A thermosetting resin composition comprising, as essential components, (a) an epoxy resin, (b) a curing agent, and (c) a silicone polymer containing a bifunctional siloxane unit represented by the formula $R_2SiO_{2/2}$ (wherein R is the same or a different organic group) in the molecule, and the silicone polymer (c) contains a bifunctional siloxane unit represented by the formula $R_2SiO_{2/2}$ (wherein R is the same or a different organic group) and a tetrafunctional siloxane unit represented by the formula $SiO_{4/2}$ in the molecule.

7. The thermosetting resin composition according to claim 4, wherein an average degree of polymerization of the silicone polymer (c) is in a range of 2 to 2000.

8. The thermosetting resin composition according to claim 4, wherein a blend amount of the silicone polymer (c) is 2% by weight or more with respect to the epoxy resin.

9. The thermosetting resin composition according to claim 4, wherein at least one end of the silicone polymer (c) is a silanol group or an alkoxy group.

10. The thermosetting resin composition according to claim 4, which further comprises a coupling agent.

11. The thermosetting resin composition according to claim 4, wherein the silicone polymer (c) contains units derived from a monomer of a bifunctional silane compound, a trifunctional silane compound, or a tetrafunctional silane compound.

12. The thermosetting resin composition according to claim 4, wherein the silicone polymer (c) contains an oligomer derived from one compound selected from a bifunctional silane compound, a trifunctional silane compound, and a tetrafunctional silane compound, or an oligomer derived from two or more compounds thereof.

13. A process for producing the thermosetting resin composition according to claim 4, which comprises a step of mixing the above components (a), (b), and (c) at the same time.

14. A process for producing the thermosetting resin composition according to claim 4, which comprises a step of mixing/stirring the above components (a), (b) and (c) at the same time in the presence of a solvent.

15. A process for producing the thermosetting resin composition according to claim 4, which comprises a step of directly using, as the silicone polymer (c), a solution which is obtained by oligomerizing a mixture of a bifunctional silane compound, a trifunctional silane compound and/or a tetrafunctional silane compound in the presence of a catalyst.

16. A thermosetting resin composition comprising, as essential components, (a) an epoxy resin, (b) a curing agent, and (c) a silicone polymer containing a bifunctional siloxane unit represented by the formula $R_2SiO_{2/2}$ (wherein R is the same or a different organic group) in the molecule, and the silicone polymer (c) contains a bifunctional siloxane unit represented by the formula $R_2SiO_{2/2}$ (wherein R is the same or a different organic group), a trifunctional siloxane unit represented by the formula $RSiO_{3/2}$ (wherein R is the same or a different organic group), and a tetrafunctional siloxane unit represented by the formula $SiO_{4/2}$ in the molecule.

17. The thermosetting resin composition according to claim 4, wherein the silicone polymer (c) contains the above bifunctional siloxane unit in the molecule in an amount of 10 mol % or more of the total silicone polymer.

18. A thermosetting resin composition comprising an epoxy resin and a curing agent as essential components, wherein a storage modulus of a cured product at 200° C. is 100 MPa or less, and a glass transition temperature of the cured product is 170° or higher.

19. A thermosetting resin composition comprising an epoxy resin and a curing agent as essential components, wherein a storage modulus of a cured product at 200° C. is 100 MPa or less and which further contains a silicone polymer having a bifunctional siloxane unit by the formula $R_2SiO_{2/2}$ (wherein R is the same or a different organic group) in the molecule.

20. The thermosetting resin composition according to claim 19, which contains 2 parts by weight or more of the silicone polymer with respect to 100 parts by weight of the epoxy resin.

* * * * *

UNITED STATES PATENT AND TRADEMARK OFFICE
CERTIFICATE OF CORRECTION

PATENT NO. : 6,787,614 B2
DATED : September 7, 2004
INVENTOR(S) : N. Takano et al.

It is certified that error appears in the above-identified patent and that said Letters Patent is hereby corrected as shown below:

Column 14,
Line 51, after "unit" insert -- represented --.

Signed and Sealed this

Twenty-sixth Day of April, 2005

JON W. DUDAS
*Director of the United States Patent and Trademark Office*